US011512982B2

(12) United States Patent
Vasiloiu et al.

(10) Patent No.: US 11,512,982 B2
(45) Date of Patent: Nov. 29, 2022

(54) ELECTROMAGNETIC MEASURING SYSTEM FOR DETECTING LENGTH AND ANGLE ON THE BASIS OF THE MAGNETOIMPEDANCE EFFECT

(71) Applicants: Victor Vasiloiu, Braunau (AT); Paul Tutzu, Braunau (AT)

(72) Inventors: Victor Vasiloiu, Braunau (AT); Paul Tutzu, Braunau (AT)

( * ) Notice: Subject to any disclaimer, the term of this patent is extended or adjusted under 35 U.S.C. 154(b) by 70 days.

(21) Appl. No.: 16/755,202

(22) PCT Filed: Oct. 9, 2018

(86) PCT No.: PCT/AT2018/060240
§ 371 (c)(1),
(2) Date: Apr. 14, 2021

(87) PCT Pub. No.: WO2019/071284
PCT Pub. Date: Apr. 18, 2019

(65) Prior Publication Data
US 2022/0128380 A1    Apr. 28, 2022

(30) Foreign Application Priority Data

Oct. 12, 2017  (DE) .......................... 102017123772.0
Sep. 13, 2018  (AT) .............................. A 50783/2018

(51) Int. Cl.
*G01B 7/00*    (2006.01)
*G01D 5/20*    (2006.01)
(Continued)

(52) U.S. Cl.
CPC ........... *G01D 5/2046* (2013.01); *G01B 7/046* (2013.01); *G01B 7/30* (2013.01)

(58) Field of Classification Search
CPC ......... G01D 5/2046; G01B 7/046; G01B 7/30
See application file for complete search history.

(56) References Cited

U.S. PATENT DOCUMENTS

| 7,791,331 B2 | 9/2010 | Servel |  |
|---|---|---|---|
| 2002/0017902 A1* | 2/2002 | Vasiloiu | G01D 5/2046 324/207.17 |
| 2008/0142346 A1* | 6/2008 | Zapf | G01D 5/2006 200/61.88 |

FOREIGN PATENT DOCUMENTS

| AT | 406715 B | 8/2000 |
| DE | 19509342 A1 | 10/1995 |

(Continued)

*Primary Examiner* — Alesa Allgood
(74) *Attorney, Agent, or Firm* — Murphy, Bilak & Homiller, PLLC (57) ABSTRACT

A measuring arrangement for distance or angle measurement and a corresponding measuring method are described. In accordance with one example, the measuring arrangement comprises a scale having magnetization which varies along a measuring direction and which brings about a correspondingly varying magnetic field. The measuring device furthermore comprises at least one scanning head which is permeated by the varying magnetic field depending on the relative position with respect to the scale in the measuring direction. The scanning head comprises the following: at least one ferromagnetic film having, on account of the magneto impedance effect, a local electrical impedance that is dependent on the magnetic field and varies along the measuring direction, and at least one sensor unit configured to generate at least two phase-shifted sensor signals which are dependent on the local electrical impedance of the film.

14 Claims, 5 Drawing Sheets

(51) Int. Cl.
  *G01B 7/04* (2006.01)
  *G01B 7/30* (2006.01)

(56) References Cited

FOREIGN PATENT DOCUMENTS

| | | |
|---|---|---|
| DE | 19953190 C2 | 11/2002 |
| DE | 102012200195 A1 | 7/2012 |
| EP | 1164358 B1 | 8/2005 |

\* cited by examiner

ELECTROMAGNETIC MEASURING SYSTEM FOR DETECTING LENGTH AND ANGLE ON THE BASIS OF THE MAGNETOIMPEDANCE EFFECT

TECHNICAL FIELD

The embodiments described here refer to a novel electromagnetic measurement apparatus for position detection which is based on the physical effect "Giant Magnetoimpedance" (GMI).

BACKGROUND

Measurement devices for determining lengths and angles that function in accordance with various principles of physics are well known. A comparison of the main characteristics of such measurement systems is offered in the following:

Optoelectronic measurement systems have a very short measuring step (the division period of the encoder) and are therefore very precise, but they are also highly sensitive to stress (shocks, vibrations) and soiling.

Magnetic measurement systems have longer measuring steps, are more robust against environmental influences, have a longer scanning distance (the distance between the read head and the scale), but they also are less accurate—due to comparably frequent interpolation errors caused by the small scanning area of the magnetic sensors and the measurement in individual periods, in combination with periodically inhomogeneous magnet strengths, and they exhibit significant reversal errors (hysteresis—when the direction of movement changes a signal jump occurs).

Inductive measurement systems have measuring steps similar in size to those of the magnetic measurement systems. They are even more accurate and they are not prone to hysteresis. The distance, however, is very small as compared to magnetic measurement systems, which limits its application possibilities.

The physical magnetoimpedance effect is itself well known and is made use of in various kinds of sensors. The magnetoimpedance effect causes a ferromagnetic or soft magnetic foil (wire), through which a high-frequency current flows, to change its impedance depending on an external electromagnetic field. This behavior can be explained with the well-known Skin effect as follows:

$$\delta = \frac{1}{\sqrt{\pi f \mu \sigma}}$$

wherein:
"δ"—Skin penetration depth,
"f"—Operating frequency,
"μ"—magnetic permeability,
"σ"—electrical conductivity.

Figure 1:
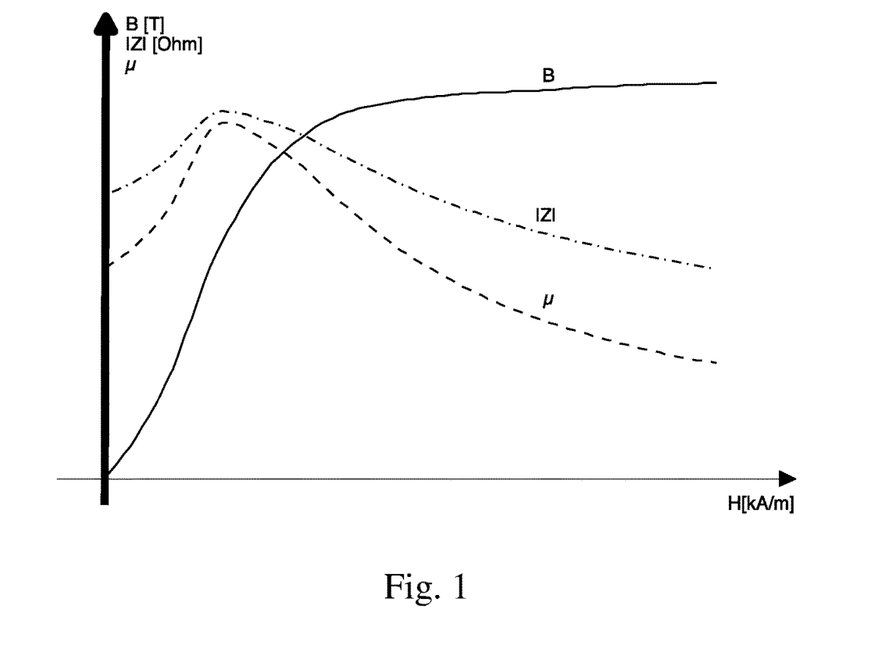
FIG. 1 is a diagram of a B-H curve.

The Skin penetration depth δ of the currents flowing through the material may change together with the frequency of the current and/or the magnetic permeability of the material. FIG. 1 symbolically shows this dependency, wherein B is the magnetic induction (flux density), H is the magnetic field strength and Z is the impedance.

An external magnetic field can change the magnetic permeability of a ferromagnetic metal foil at a factor of $10^N$ (wherein N>2). This means that the magnetoimpedance effect exhibits a very high impedance/reluctance change $$\left(\frac{\Delta X}{X_0}\right) \times 100\%.$$

If one compares the penetration depth δ of a material under the influence of two electromagnetic fields with field strengths of H1 and H2 in two different areas, for the ratio $\delta_1/\delta_2$ one obtains as a result the respective penetration depths:

$$\frac{\delta_1}{\delta_2} = \frac{\sqrt{\pi f \mu_2 \sigma}}{\sqrt{\pi f \mu_1 \sigma}} = \sqrt{\frac{\mu_2}{\mu_1}} > 10^{N/2}, \text{ wobei } N > 2.$$

As the impedance T is basically inverse proportional to the penetration depth δ, the ratio $Z_2/Z_1$ of impedances are as follows:

$$Z \sim \frac{1}{\delta} \rightarrow \frac{Z_2}{Z_1} > 10^{N/2}, \text{ wobei } N > 2.$$

This high level of sensitivity is what constitutes the magnetoimpedance effect and, when applied, results in high signal contrast, which in turn provides excellent efficiency rates.

In the following, a few examples of measurement devices that make use of the GMI effect will be discussed. Known from the patent document U.S. Pat. No. 7,791,331 B2 is a device for measuring lengths, comprising two meander shaped coils made of a ferromagnetic alloy and a single movable magnet. Due to the triangular geometry of these coils, through which high frequency electricity flows, a variation of their impedance arises in dependency on the relative position of the magnet. The measurement area of such a constellation, however, has its limits with regard to the position resolution and degree of accuracy that can be achieved.

An angle encoder is disclosed in the patent document DE 19953190 C2. It is comprised of a star-shaped conductor that has a planar geometry and which is made of a ferromagnetic alloy and of a permanent magnet which can rotate around this conductor relative to its axis. This kind of encoder is not capable of detecting the rotation direction (only the rotation speed) and has very few impulses per rotation (resolution).

A manually handled read head for reading magnetically coded tapes is disclosed in the patent document AT 406715 B. This device, however, is only capable of reading magnetic patterns on the tapes and is not designed to detect length.

The inductive length and angle measurement system described in the patent document EP 1164358 B1 and known in the marketplace by the name of AMOSIN® achieves high levels of accuracy and resolution in the lower micrometer range and is not prone to hysteresis. It has, however, the disadvantage that the distance between the scale and the read head is around two times smaller than that of the measurement apparatus disclosed here, whereas the division periods are of equal length. Furthermore, the sensor of the measurement apparatus presented for the first time here is of a very simple construction, has a much higher degree of sensitivity and exhibits higher signal amplitudes.

The inventors have set themselves the goal of providing an apparatus for measuring length or angle that makes uses of the magnetoimpedance effect and which allows for a high degree of accuracy and relatively large sensing distances without being affected by the undesired Hysteresis phenomenon. It is also desirable to keep the manufacturing costs of the sensor system low and to allow for flexibility in the choice of the sensor carrier. A large scanning area throughout multiple periods of the magnetic scale is also desired in order to obtain good signal averaging and a high degree of granularity.

SUMMARY

The aforementioned goal is achieved with the measurement apparatus in accordance with claim 1, as well as by means of a method in accordance with claim 10. Various embodiments and further developments form the subject matter of the dependent claims.

BRIEF DESCRIPTION OF THE DRAWINGS

Various embodiments will now be described in greater detail based on the figures. The illustrations are not necessarily true to scale and the invention is not limited to the aspects illustrated here. Instead emphasis is place on illustrating the underlying principles of the invention.

DETAILED DESCRIPTION

The embodiments described here (see FIG. 2) include a magnetic scale 1 with a hard-magnetic division and with alternating north and south poles of the same or differing pole lengths, as well as with a read head 2 that comprises a planar sensor unit 3 and an evaluation circuitry 4. The sensor unit 3 includes a ferromagnetic foil 6 (cf. FIG. 3, FIG. 5 and FIG. 6).

Figure 2:
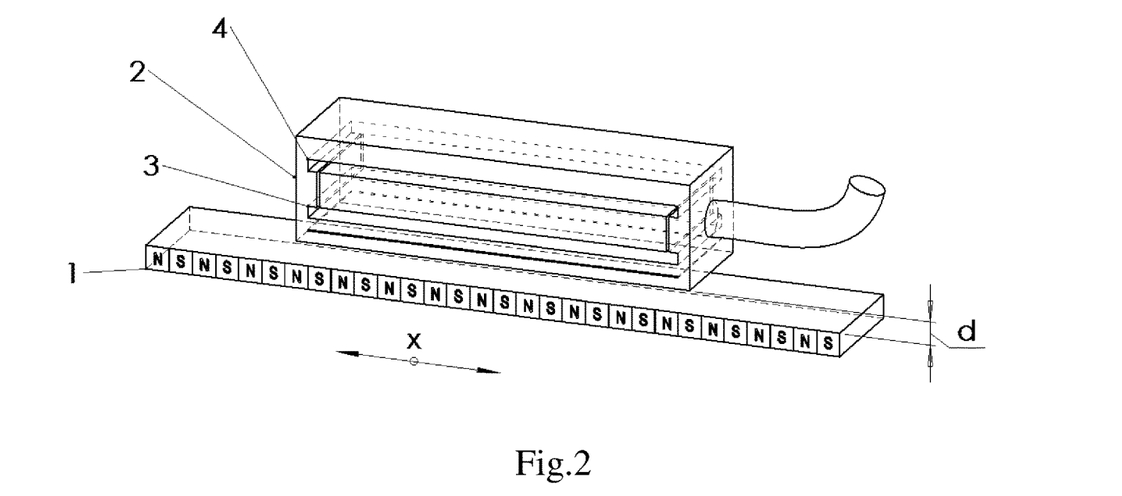
FIG. 2 illustrates the main components of the embodiments described here.

These two main components of the measurement apparatus (scale 1 and read head 2) are arranged with an air gap "d" between them and are mechanically coupled to two machine elements which can move linearly or rotationally relative to each other and whose relative or absolute position (linear position or angular position) is being detected.

By means of the magnetic fields produced by the scale division in the ferromagnetic foil arranged in the read head 2, corresponding regions of higher and lower permeability, that is, of higher and lower impedance, are generated. This position-dependent variation in impedance is detected using one or more sensor elements and, following the electronic processing in the evaluation circuitry of the sensor signals generated by the sensor elements, it is reproduced in the form of positional information. In comparison to other sensors (AMR, GMR, etc.), the measuring systems described here can produce valid positional information even when the ferromagnetic foil, or local regions thereof, is (are) magnetically saturated. This means that the functionality of the ferromagnetic foil remains intact, irrespective of whether the foil is employed in a magnetically linear or a magnetically non-linear area of whether or not it is magnetically saturated.

FIG. 2 illustrates an embodiment of a measuring system that can use the GMI effect to measure position (path or angle). The illustrated measuring system includes a scale 1, implemented as a thin strip which, due to the magnetization of a hard-magnetic layer of the strip, comprises alternating polarities (north N and south S), illustrated here, for the sake of simplicity, in periods (which need not necessarily be the case). Essentially, the scale is a permanent magnet with varying polarization. The magnetic field generated by the permanent magnet is position-dependent and varies, for example, throughout the periods of the divided scale 1.

The measuring system further has a read head 2 comprised of a magnetic impedance sensor constructed on a thin flexible substrate (hereinafter designated as sensor unit 3), as well as an evaluation circuitry 4 configured to process the sensor signals of the sensor unit 3 and to convert them into information regarding the relative position of the read head (in relation to the scale 1 and in the direction of measurement "x"). The scan is carried out contactles sly at a distance "d" (air gap) of the scale 1 to the read head 2.

The functioning of the measurement system in accordance with the example of FIG. 2 will now be explained in greater detail with reference to the diagram shown in FIG. 3. In accordance with the embodiment illustrated in FIG. 3, the sensor unit 3 comprises a flexible, non-magnetic substrate 5 on which individual thin foils 6, (four thereof in the present example), of a ferromagnetic material are disposed in a certain arrangement, electrically unconnected to each other. In the following, the foils 6 are also referred to as sensor elements.

In the example illustrated here, the ferromagnetic foils 8 (sensor elements) within each pair of 2 sensor elements are arranged at a distance of approximately $\lambda/2$ to each other, wherein $2\cdot\lambda$ is the (magnetic) division period of the scale 1. The length of a sensor element roughly corresponds to the magnetic width of the scale 1 transversely to the direction of measurement. A first pair of the foils 6, labeled S+ and S−, is designated for a sine channel, whereas a second pair of foils 6, labeled C+ and C−, is designated for a cosine channel. The two pairs of foils (S+, S− and C+, C−) are arranged on the substrate at a distance of approximately $n\cdot\lambda+\lambda/4$ to each other, wherein n is a whole number.

In one particular embodiment, numerous first pairs of foils can be designated for the sine channel and numerous second pairs of foils can be designated for the cosine channel. Two of the pairs of foils designated for the sine channel (or for the cosine channel) are arranged at a distance of $n\cdot\lambda$ to each other, whereas each of the two pairs of foils, as previously mentioned, are at a distance of approximately $n\cdot\lambda+\lambda/4$ to each other when they are arranged in different channels.

The thickness of the foils 6 may fall within the approximate range of 5 µm to 30 µm, depending on how the measurement system is designed and on the properties of the materials used, the work frequency, division periods, etc.

Figure 3:
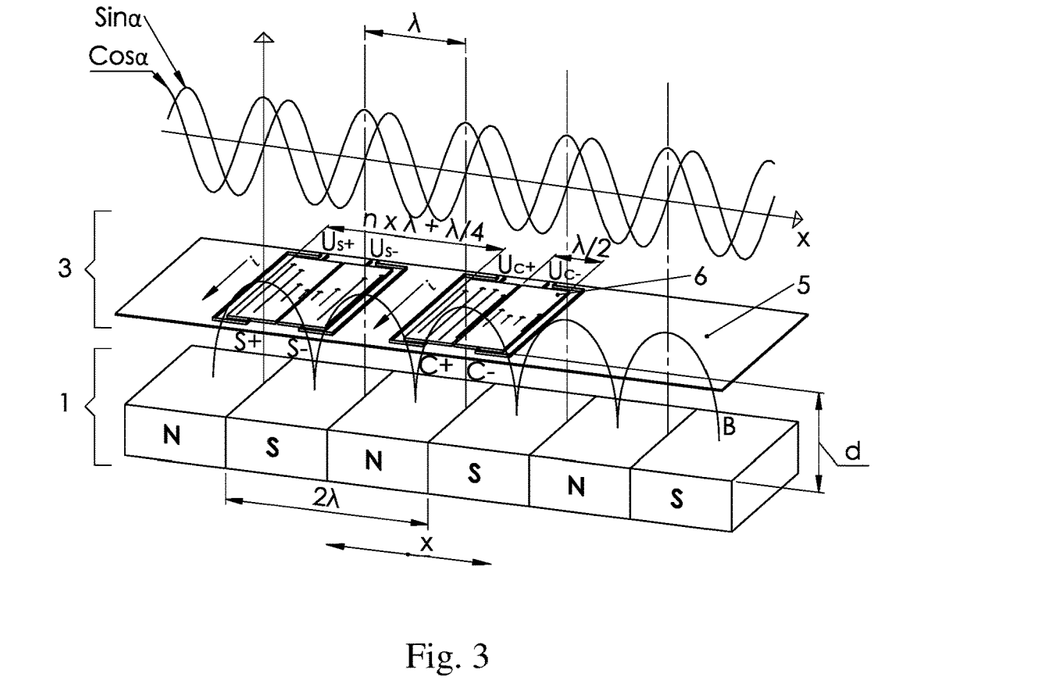
FIG. 3 illustrates a first embodiment of a measurement system for measuring path or angle.

For the sake of simplicity, only a minimal number of sensor elements are illustrated in FIG. 3. As previously mentioned, repeatedly arranging numerous pairs of sensor elements along the direction of measurement "x" at a distance of $n\cdot\lambda$ to each and summing the sensor signals of the sensor elements 6 for each of the two measurement channels (sine and cosine) may be of an advantage when extracting the signals and generating messages regarding technical failures (e.g. geometric errors) occurring in the sensors or scale.

Figure 4:
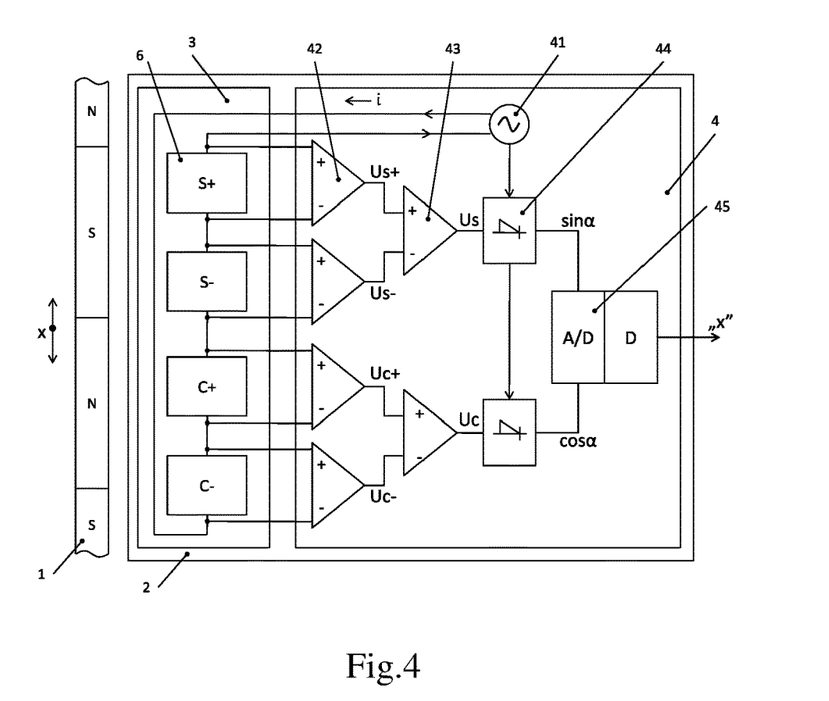
FIG. 4 illustrates an exemplary embodiment of an electronic circuit for signal evaluation.

In accordance with the example of FIG. 4, the read head 3 comprises an evaluation circuitry 4 and a signal generator 41 configured to generate high frequency (within the range of 1 MHz to approximately 100 MHz) carrier currents of a constant amplitude. Each of the four sensor elements 6 illustrated here (designated S+, S−, C+, C−) is electrically connected to the signal generator such that the carrier current i flows through them. In the examples illustrated here, the sensor elements 6 are connected in rows, so that the same carrier current i flows through the sensor elements 6.

The sensor elements 6 (foils) arranged in the sensor unit 2 are penetrated by the magnetic field generated by the scale 1 (magnetic flux density B). As mentioned, the magnetic field varies along the direction of measurement (the direction x) in accordance with the division of the scale and therefore the local magnetic field strength/flux density in the sensor elements 6 depends on the relative position of the sensor unit 2 to the scale 1. When the scale is shifted relative to the sensor unit the magnetic field moves correspondingly.

As previously mentioned, the magnetoimpedance effect (GMI effect) causes the relative permeability in each of the sensor elements/foils 6 to change in dependency on the magnitude of the magnetic flux density B, causing the current penetration depth (Skin effect) of the high-frequency excitation current to also change as a result and thereby changing the impedance of the sensor elements/foils 6, as well. Measuring the impedance of the four sensor elements/foils 6 by means of the evaluation circuitry 4 reveals the dependency of these impedances on the relative position of the read head 2 to the scale 1. As mentioned, a constant current i can be supplied to the sensor elements/foils 6 and the resulting voltages $U_{S+}$, $U_{S-}$ and $U_{C+}$, $U_{C-}$ (the drops in voltages throughout the sensor elements 6) can be evaluated.

In order to achieve a high degree of resistance to interference and to suppress any undesired signal offset or static noise, the signal detection (e.g. voltages $U_{S+}$, $U_{S-}$ and $U_{C+}$, $U_{C-}$) can be carried out differentially, thereby determining a sine signal ($U_S$) from the voltage difference obtained by $U_{S+}-U_{S-}$ and determining a cosine signal ($U_C$) from the voltage difference obtained by $U_{C+}-U_{C-}$ (e.g. with the aid of differential amplifiers 42 and 43). The differential signals $U_S$ and $U_C$ (sine and cosine signals) have the same frequency as the high-frequency carrier current i. The signals $U_S$ and $U_C$ are demodulated in the example of FIG. 4 (demodulator 44). The result of the modulation is a DC voltage, the level of which varies in roughly sinusoidal or cosinusoidal waves as the scale 1 is steadily moved in relation to the read head 2. In order to simplify the illustration, in the examples shown in FIGS. 3 and 4, as well as in the following examples, the two signals sin α and cos α, which are shifted in phase by around 90°, are represented after the demodulation 44 of the high-frequency carrier wave.

The design of an electronic circuit that can amplify and transform the sensor signals and provide them to the electronic circuitry that is connected downstream for determining position and/or controlling the drive via the well-known, standardized interfaces at the output of the read head 2 is also commonly known and will not be described further here. It is important to note, however, that, by generating the two phase-shifted sinusoidal signals, the specific direction of movement and the electric angle in a period can be definitively determined.

As previously mentioned, the four ferromagnetic foils (sensor elements 6) can move within the sensor unit 3 relative to the magnetic scale 1. A current, constant in frequency and amplitude (carrier current i) and generated by current source 41 disposed in the evaluation circuitry 4, runs through these sensor elements 6. The drop in voltage (see FIG. 4, voltages $U_{S+}$, $U_{S-}$ and $U_{C+}$, $U_{C-}$) over each of the four sensor elements 6 can be regarded as the magnitude for the impedance of the respective foil. These voltages $U_{S+}$, $U_{S-}$ and $U_{C+}$, $U_{C-}$ are provided by the differential amplifier 42 with the following parameters:

$I_0$—constant current amplitude,
i—carrier current,
$\omega=2\pi f$, f—constant frequency,
$\chi$—position of the scale relative to the sensor unit 3,
$\lambda$—one half of the magnetic division period,
k—an integer number,
$U_{S+}$, $U_{S-}$, $U_{C+}$, $U_{C-}$—component voltages
$U_k$—constant transfer voltage,
$U_{OS}$, $U_{OC}$—constant offset voltage,
$\alpha=2\pi/\lambda x$—electric angle,
and $i=I_0 \sin \omega t$
results in:

$$U_{S+} = U_k\left(U_{OS} + \sin\left(\frac{2\pi}{\lambda}x + 2k\pi\right)\right)\sin\omega t, \text{ and}$$

$$U_{S-} = U_k\left(U_{OS} + \sin\left(\frac{2\pi}{\lambda}x + \pi + 2k\pi\right)\right)\sin\omega t,$$

and analogously:

$$U_{C+} = U_k\left(U_{OC} + \sin\left(\frac{2\pi}{\lambda}x + \frac{\pi}{4} + 2k\pi\right)\right)\sin\omega t, \text{ and}$$

$$U_{C-} = U_k\left(U_{OC} + \sin\left(\frac{2\pi}{\lambda}x + \frac{\pi}{4} + \pi + 2k\pi\right)\right)\sin\omega t,$$

and, after obtaining the differences (operation amplifier 43) for each of the two measurement channels (sine and cosine channels):

$U_S = U_{S+} - U_{S-} = U_k \sin \alpha \sin \omega t$ $U_C = U_{C+} - U_{C-} = U_k \cos \alpha \sin \omega t$ With the aid of these two "quadrature" voltages, the electric angle and the direction of movement can be determined in a well-known manner using the demodulators 44, the analog to digital converters 45 and further digital processing and these can be output as the position information "x".

Here attention should be called to the fact that, as opposed to inductive measurement systems, the sensor signal periods λ are only half as long as the division periods (2λ) of the scale because the impedance changes here only depend on the magnitude of the flux density B and not on its direction vector. This produces significant advantages for the design of the measurement system and allows for greater accuracy and resolution.

It should further be noted that, as a result of the high degree of efficiency exhibited by the magnetoimpedance effect in the embodiments described here, higher sine and cosine signal amplitudes are achieved, which allows for a comparatively large air gap d and makes the measurement system described in the embodiments illustrated here suitable for a much wider range of applications than conventional measurement systems.

Figure 5:
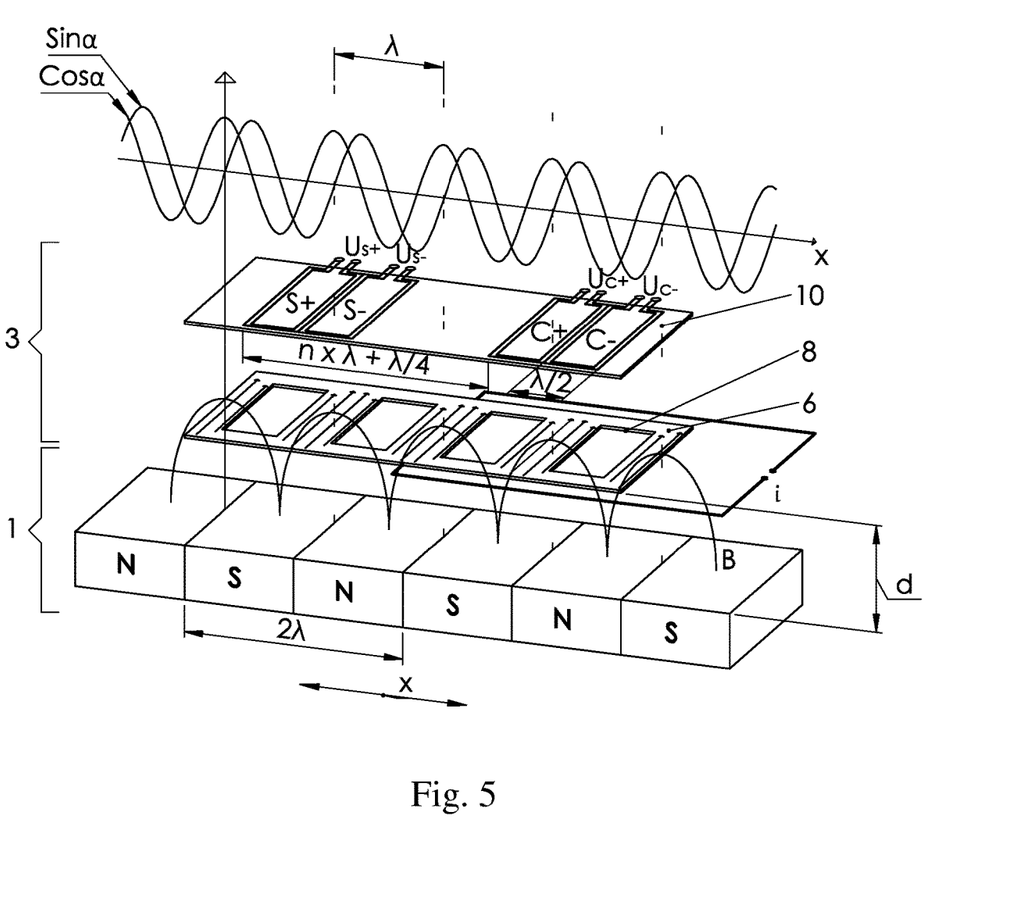
FIG. 5 illustrates a second embodiment of a measurement system for measuring path or angle.

FIG. 5 illustrates a second embodiment of the measurement system, wherein in the example shown here, the sensor unit 3 is implemented as follows: A ferromagnetic foil 6 is connected to the signal source 41 (cf. FIG. 4) such that a high-frequency carrier current (excitation current) i ($i=I_0 \cdot \sin(\omega t)$) is made to flow through it in a transverse direction (transversely to the direction of measurement x). In this case the foil 6 has at least two recesses 8, each with a width of approximately $\lambda/2$ and disposed at a distance of approximately $n \cdot \lambda + \lambda/4$. The local current density in the foil 6 depends on the aforementioned magnetoimpedance effect. In dependency on the magnetic flux density B generated by the scale 1, local regions of varying impedance arise in the foil 6 and thus the local current density in the foil 6 will essentially mirror the local flux density B and, in effect, the division of the scale 1, as well. This "current image" can be differentially detected by planar receiver coils 10 arranged parallel to the foil 6, by means of which the two phase-shifted signals $U_S$ and $U_C$ can be obtained in the same manner as is the embodiments in accordance with FIGS. 3 and 4.

The recesses 8 in the foils may also be omitted from this embodiment if the system dimensions allow. The receiver coils 10 can be implemented, for example, as a multilayer printed circuit board. With the application of generally known methods, the magnetic fields that are detected by the receiver coils 10 can also be detected by other types of sensors such as semiconductor sensors, for example, Hall sensors, or by magnetic thin-film sensors such as, for example, magnetic resistance (MR), giant magnetic resistance (GMR) or anisotropic magnetic resistance (AMR) sensors.

Figure 6:
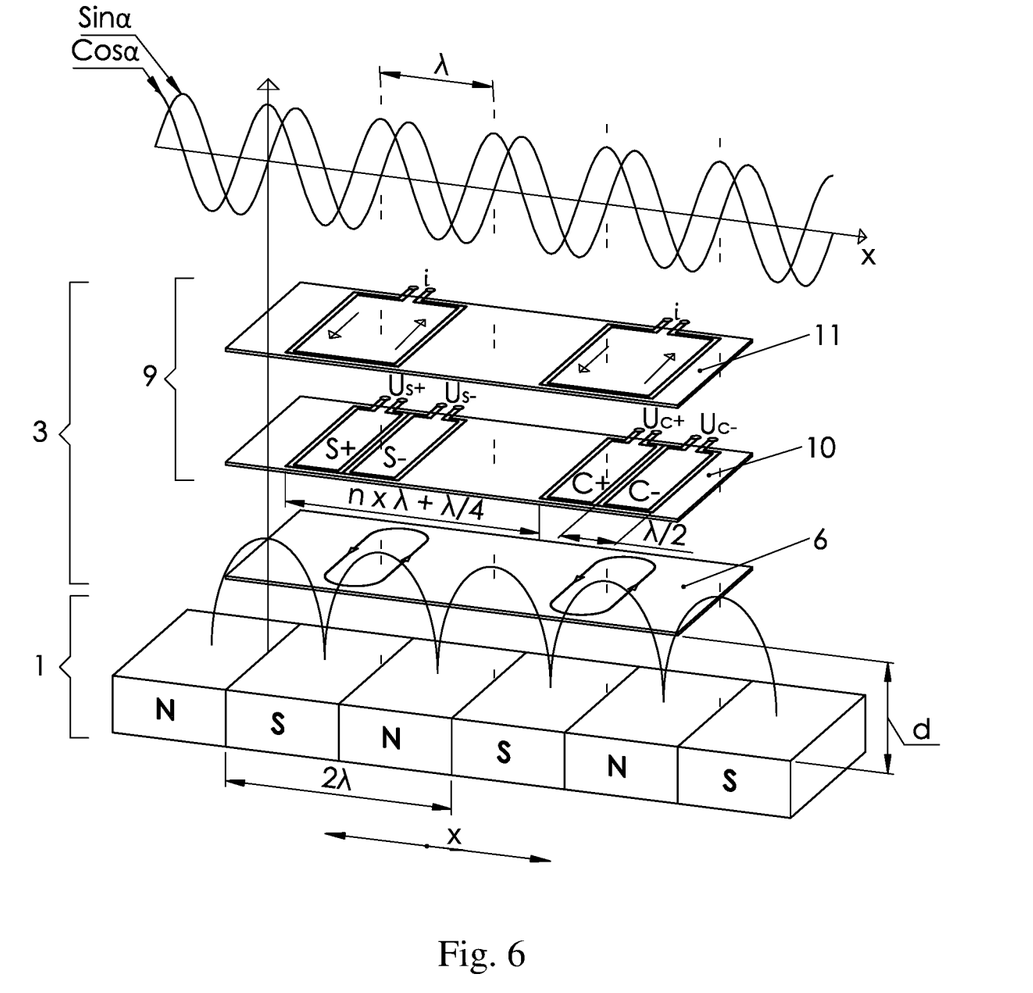
FIG. 6 illustrates a third embodiment of a measurement system for measuring path or angle.

FIG. 6 illustrates a third embodiment of the measurement apparatus. In this case, as opposed to the preceding example, the high-frequency carrier current i is not supplied directly to the ferromagnetic foil 6, but rather to emitter coils 11 which, together with the receiver coils 10, form a planar coil structure 9.

In an as such known manner, the emitter coils 11 induce eddy currents in the ferromagnetic foil 6. The strength and the spatial position (along the direction of measurement "x") of these eddy currents depend on the variable magneto-impedance in certain regions of the foil 6 and is inversely proportional to the local magnetic flux density B of the magnetic field generated by the scale 1. The receiver coils 10 essentially fulfill the same function as in the previous example of FIG. 5 and differentially detect the locally varying eddy currents in the regions of the foil directly opposite from themselves. This embodiment has the advantage of allowing the ferromagnetic foil to be realized as a passive element and the coil system to be implemented as a flexible multilayer printed circuit board that can be easily connected to the evaluation circuitry.

Figure 7:
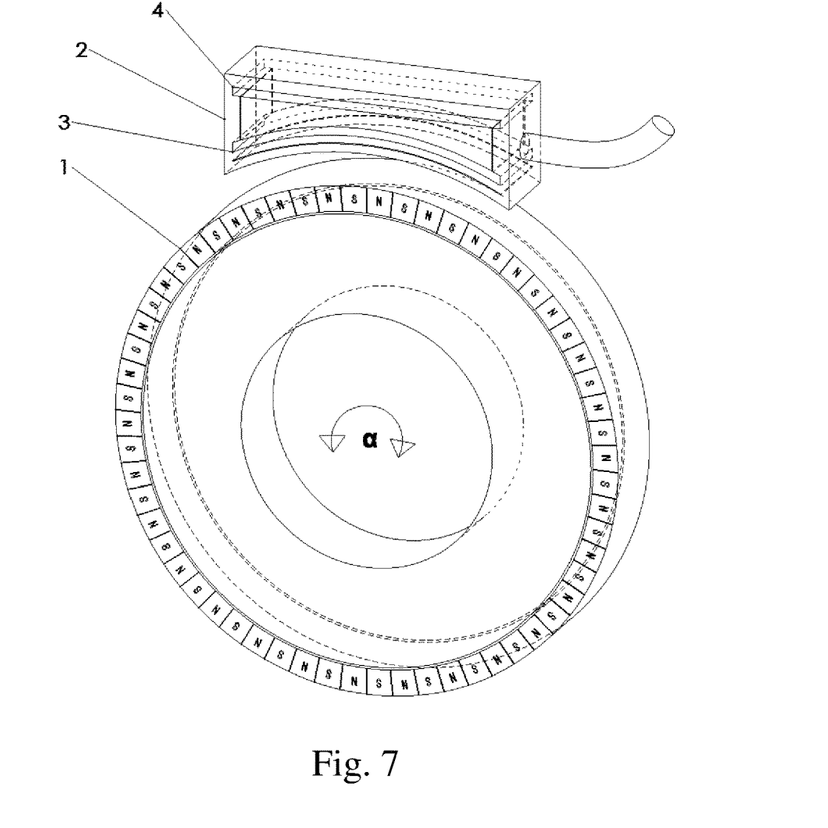
FIG. 7 illustrates a forth embodiment of a measurement system that is suitable for measuring angles.

As indicated previously, the fact that the scanned surface encompasses numerous periods of the scale is an advantage for the position measurement apparatus. By employing the embodiments of this measurement apparatus with its flexible foil-like sensor units 3, a measurement apparatus for measuring angles can also be realized while keep the air gap d the same. One such exemplary implementation is illustrated in FIG. 7. Its functionality is essentially the same as the linear measurement arrangements described above, although here the scale 1 is implemented as a measurement drum (encoder wheel, multi-polar wheel) and can rotate relative to the read head 2.

The surface of the read head 2 or, respectively, of the sensor unit 3 can be easily adapted to any outer diameter of the encoder wheel. In the case of other measurement systems that instead comprise rigid sensor elements, this is not easily done.

Length and angle measurement systems can be generally categorized, in accordance with their functionality, as incremental and absolute measurement systems. Incremental measurement systems only have a periodically structured scale 1 and the positional information can be output in the form of upward or downward counts of measuring pulses after an electric "reset". Absolute measurement systems, on the other hand, can provide the absolute position of the scale 1 relative to the read head 2 at any point in time and irrespectively of the preceding waveform.

In order to obtain one or more "reference pulses" using incrementally working measurement systems, an additional second track, extending parallel to the main measurement track, may be provided. This "reference track" can be realized in all of the embodiments described here as any desired sequence of individual pairs of north/south poles. A sensor disposed in the sensor unit can be realized with the same technology as the sensor elements in the embodiments described above and, when a pair of north/south poles is detected, it can detect and output a corresponding reference signal.

Figure 8:
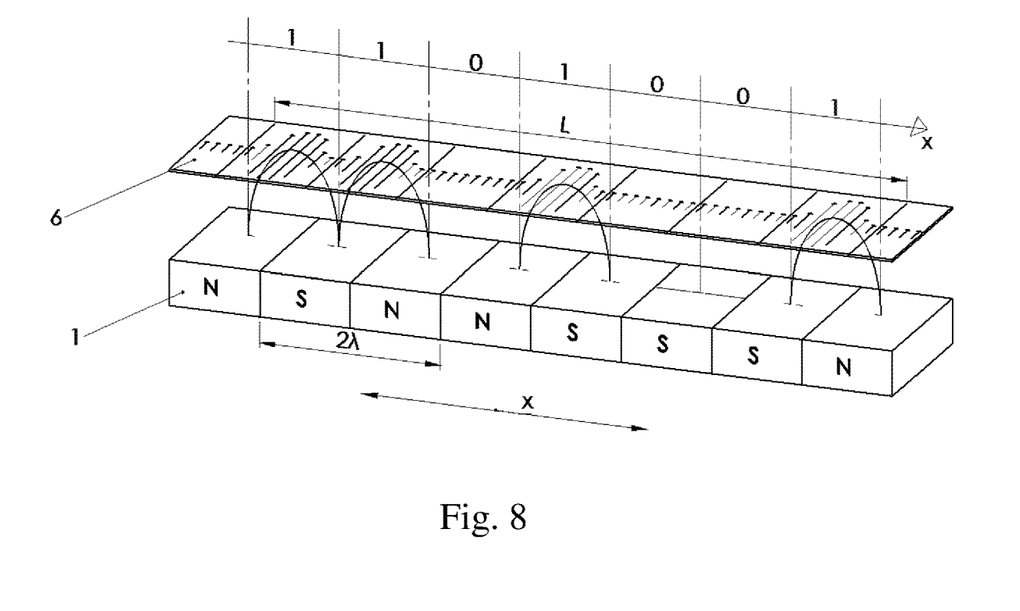
FIG. 8 illustrates an example of a magnetic scale for a measurement system for measuring absolute position.

In addition, a system for detecting the absolute (lateral or angular) position can also be realized for each of the exemplary measurement systems described here (see FIG. 8).

For measuring the absolute position, the scale has a code that specifically defines an absolute position and which can be realized according to various principles. As one example, in FIG. 8 a so-called "random code"—in the absolute track implementation—is shown, wherein the scale 1 comprises a sequence of north/south magnetic poles of the same or differing length and any given combination of the lengths (code) only appears once in the entire area of measurement. All of the embodiments described here are capable of detecting a similar absolute track. After processing the signal, a uniformly arranged sensor surface, consisting of individual, differentially working sensor elements, provides a certain code, e.g. "1101001" that defines the absolute position at one single location.

Naturally, in order to obtain a higher positional resolution, an absolute track can be applied on the scale parallel to a high resolution incremental track and the two can be evaluated in combination using known methods.

In the following, a few aspects of the embodiments described here will be summarized. The following listing should not be understood as exhaustive, but rather simply exemplary.

EXAMPLE 1

A measurement system for measuring path or angle, comprising a scale 1 with a magnetization that varies in a direction of measurement x and that generates a correspondingly varying magnetic field B, further comprising at least one sensor unit 2 that is penetrated by the magnetic field B and which comprises the following: at least one ferromagnetic foil 6 which, due to the magnetoimpedance effect, exhibits a local electrical impedance that is dependent on the magnetic field B and which varies along the direction of measurement x; still further comprising at least one sensor element (cf. e.g. FIGS. 3, 5, 6, numerals 6, 7, 10) configured to generate a sensor signal (e.g. $U_{S+}$, $U_{S-}$, $U_{C+}$, $U_{C-}$) that is dependent on the local electrical impedance in one region of the foil 6.

EXAMPLE 2

The measurement system in accordance with example 1, further comprising a signal source 41 (cf. FIG. 4) configured to provide an alternating current i, wherein the at least one ferromagnetic foil 6 is connected to the signal source and the alternating current i flows through the at least one ferromagnetic foil 6 transversely to the direction of measurement x and exhibits a constant frequency and a constant amplitude when in operation and, wherein a resulting current density (distribution of the alternating current i) in the at least one ferromagnetic foil 6 is of varying height due to the local electrical impedance that varies along the direction of measurement x.

EXAMPLE 3

The measurement system in accordance with example 1, further comprising a signal source 41 (cf. FIG. 4) which is configured to provide an alternating current i that is supplied to the at least one foil 6, wherein the at least one foil 6 comprises at least two foils arranged next to each other along the direction of measurement x and, wherein the at least one sensor element (cf. FIG. 3, numeral 6) comprises at least two sensor elements S+, S−, C+, C−, which are formed by the foils themselves and from which one voltage each is tapped as the sensor signals $U_{S+}$, $U_{S-}$, $U_{C+}$, $U_{C-}$ transversely to the direction of measurement x.

EXAMPLE 4

The measurement system in accordance with example 1, further comprising a signal source 41 (cf. FIG. 4) which is configured to provide an alternating current i that is supplied to the at least one foil 6, wherein the at least one sensor element is a magnetic field-sensitive semiconductor sensor element or a magnetic field-sensitive thin layer sensor element which generates a sensor signal representing a magnetic field produced by the alternating current flowing through the at least one foil 6.

EXAMPLE 5

The measurement system in accordance with any of the examples 1 to 4, wherein the at least one sensor element comprises a planar coil (cf. FIG. 5, coils 10).

EXAMPLE 6

The measurement system in accordance with any of the examples 1 to 5, wherein the at least one sensor element comprises a first sensor element S+ and a second sensor element S− arranged next to each other along the direction of measurement and wherein the sensor signals US+, US− of the first sensor element S+ and of the second sensor element S− are combined into a differential signal (cf. FIGS. 3 to 6).

EXAMPLE 7

The measurement system in accordance with example 1, wherein the at least one sensor element comprises a planar coil 10, wherein the sensor unit 3 further comprises at least one emitter coil 11 that is connected to the signal source 41 and that is inductively coupled to the at least one planar coil 10 (cf. FIG. 6) and wherein the at least one foil 6 functions as an iron core in which eddy currents are induced that depend on the local impedance of the at least one foil 6.

EXAMPLE 8

The measurement system in accordance with any of examples 1 to 7, wherein the scale 1 has a regular division 2·λ, and wherein the at least one sensor element comprises at least two sensor elements from a first group and at least two sensor elements from a second group, wherein the sensor elements of the first group are at a distance to each other that corresponds to a multiple of the half division λ and wherein the sensor elements of the second group are at a distance to the sensor elements of the first group that corresponds to a multiple of the half division plus one quarter of the division (i.e. n·λ+λ/4).

EXAMPLE 9

The measurement system in accordance with any of the examples 1 to 8, wherein the scale 1 comprises numerous tracks extending next to each other.

EXAMPLE 10

The measurement system in accordance with any of the examples 1 to 9, wherein the scale 1 has an absolute code that specifically defines the position of the scale 1 relative to the sensor unit 2.

EXAMPLE 11

The measurement system in accordance with any of the examples 1 to 10, wherein the scale 1 has a cylindrical shape and the division of the scale 1 is an angle division.

EXAMPLE 12

A method for measuring the relative position between a scale land a sensor unit 2 spaced apart from the scale 1. In accordance with this example, the method comprises generating, by means of the scale 1, which has a varying magnetization along the direction of measurement, a magnetic field B that varies along a distance of measurement x and further comprises influencing the local electrical impedance of at least one foil 6 arranged in the sensor unit 2, wherein, due to the magnetoimpedance effect, the local electrical impedance is dependent on the local magnetic field and likewise on the position of the scale 1 relative to the sensor unit 2. The method further comprises detecting, by means of at least one sensor element, a signal representing the local electrical impedance in a region of the at least one foil 6.

EXAMPLE 13

The method in accordance with example 11, further comprising: supplying a high-frequency alternating current to the at least one foil 6, wherein the current density along the direction of measurement x depends on the local electrical impedance of the at least one foil 6 and comprising the demodulation of the signal detected by the sensor element.

EXAMPLE 14

The method in accordance with example 13, wherein detecting a signal by means of a sensor element comprises the following: tapping a voltage from the at least one foil 6, wherein the voltage is dependent on the local impedance, or detecting—by means of a planar coil or of a magnetic field-sensitive semiconductor element or of thin layer sensor elements—a sensor signal representing a strength of a magnetic field generated by the alternating current flowing through the at least one foil 6.

EXAMPLE 15

The method in accordance with example 13, wherein the local electrical impedance of the at least one foil 6 is influenced by the alternating current flowing through the at least one emitter coil 11, wherein a planar coil is used as the sensor element that is inductively coupled to the emitter coil 11 and the at least one foil 6 functions as an iron core.

All of these examples can be employed both in systems for measuring paths (from shifts or from a position), as well as in systems for measuring angles (in rotating encoders). Each and every example also makes it possible to carry out both an incremental (relative) measurement of (angular) position, as well as a measurement of an absolute (angular) position.

The invention claimed is:

1. A measurement system for measuring paths or angles, comprising
    a scale that has a magnetization which varies along a direction of measurement and which generates a correspondingly varying magnetic field, and
    at least one read head that is penetrated by the varying magnetic field in dependency on the relative position to the scale in the direction of measurement and which comprises the following:
    at least one ferromagnetic foil which, due to the magnetoimpedance effect, exhibits a varying local electrical impedance, which depends on the magnetic field, along the direction of measurement; and
    at least one sensor unit configured to produce two phase-shifted sensor signals that are dependent on the local electrical impedance of the at least one ferromagnetic foil.

2. The measurement system in accordance with claim 1, further comprising a signal source configured to provide an alternating current that has constant amplitude and constant frequency,
    wherein the at least one sensor unit comprises at least one emitter coil that is connected to the signal source and that is inductively coupled to a planar receiver coil, and
    wherein the at least one ferromagnetic foil functions as an iron core in which the at least one emitter coil induces eddy currents that depend on the local impedance of the at least one ferromagnetic foil.

3. The measurement system in accordance with claim 1, further comprising:
    a signal source configured to provide an alternating current that has a constant amplitude and a constant frequency and that is supplied to at least two ferromagnetic foils arranged, spaced apart, along the direction of measurement,
    wherein the at least two ferromagnetic foils themselves comprise the sensor elements of the at least one sensor unit and
    wherein the magnetic field that varies along the direction of measurement and which depends on the position of the scale relative to the at least one read head influences the impedance of the at least two ferromagnetic foils, which is evaluated as measurement information.

4. The measurement system in accordance with any of claim 1 or 3,
    wherein the local current strengths in the at least one ferromagnetic foil that locally vary due to the magnetic field are detected by planar coils.

5. The measurement system in accordance with any of claims 1 to 2,
    wherein the formation of each of the sensor signals is carried out by forming the difference between each of two measurement information signals;
    wherein the two measurement information signals are each generated by a pair of individual sensor elements that are arranged spaced apart in the at least one sensor unit along the direction of measurement.

6. The measurement system in accordance with any of claims 1 to 5,
    wherein the scale has a regular division with a twofold period $(2\cdot\lambda)$ and
    wherein the at least one sensor unit comprises at least two sensor elements from a first group and at least two sensor elements from a second group,
    wherein the sensor elements of the first group are at a distance to each other that roughly corresponds to uneven multiple of the half period $((2n+1)\cdot\lambda/2)$ and
    wherein the sensor elements of the second group are at a distance relative to the sensor elements of the first group that roughly corresponds to a multiple of the half period plus a quarter of the period $(n\cdot\lambda+\lambda/4)$.

7. The measurement system in accordance with any of claims 1 to 6,
    wherein the scale comprises numerous magnetic tracks extending next to each other.

8. The measurement system in accordance with any of claims 1 to 7,
    wherein the scale has an absolute code that specifically defines the position of the scale relative to the at least one read head.

9. The measurement system in accordance with any of claims 1 to 8,
    wherein the scale has a cylindrical shape the division of the scale is an angular division.

10. The measurement system in accordance with any of claims 1 to 8,
    wherein the functionality of the at least one ferromagnetic foil is maintained both in a linear and a nonlinear range, as well as in the presence of magnetic saturation.

11. A method for measuring the relative position between a scale and a read head that is spaced apart from the scale; the method comprising:
    producing a magnetic field that varies along a direction of measurement by means of a scale that exhibits a magnetization which varies along the direction of measurement;
    influencing the local electrical impedance of at least one foil that is arranged in the at least one sensor unit, wherein, due to the magnetoimpedance effect, the local electrical impedance is dependent on the local magnetic field and thus on the position of the scale relative to the at least one sensor unit, and thereby producing at least two phase-shifted measurement signals;
    detecting a signal, by means of a sensor element, which represents the local electrical impedance in a region of the at least one foil.

12. The method in accordance with claim 11, further comprising:
    supplying a high-frequency alternating current to the at least one foil, wherein the current distribution along the direction of measurement is dependent on the local electrical impedance of the at least one foil, and evaluating, in particular demodulating, the signal detected by the sensor element.

13. The method in accordance with claim 12, wherein detecting a signal by means of a sensor element comprises:

tapping a voltage off of at least one foil, wherein the voltage is dependent on the local impedance or detecting—by means of a planar coil or of a magnetic field-sensitive semiconductor element or of a thin-layer sensor element—a sensor signal that represents a strength of a magnetic field produced by the alternating current flowing locally through the at least one foil.

14. The method in accordance with claim 13, wherein the local electrical impedance of the at least one foil influences the eddy currents induced by at least one emitter coil, wherein, as a sensor element, a planar receiver coil is used that is inductively coupled to the at least one emitter coil and the at least one foil functions as an iron core.

* * * * *